United States Patent [19]
Ramdane et al.

[11] Patent Number: 5,680,411
[45] Date of Patent: Oct. 21, 1997

[54] INTEGRATED MONOLITHIC LASER-MODULATOR COMPONENT WITH MULTIPLE QUANTUM WELL STRUCTURE

[75] Inventors: Abderrahim Ramdane, Sceaux; Fabrice Devaux, Paris; Abdallah Ougazzaden, Foutenay aux Roses, all of France

[73] Assignee: FRANCE TELECOM Etablissement autonome de droit public, Paris, France

[21] Appl. No.: 735,490

[22] Filed: Oct. 23, 1996

Related U.S. Application Data

[63] Continuation of Ser. No. 561,549, Nov. 21, 1995, abandoned, which is a continuation of Ser. No. 253,252, Jun. 2, 1994, abandoned.

[30] Foreign Application Priority Data

Jun. 2, 1993 [FR] France ................... 93 06565

[51] Int. Cl.$^6$ ................................................. H01S 3/19
[52] U.S. Cl. ........................ 372/50; 372/26; 372/102
[58] Field of Search ......................... 372/50, 26, 46, 372/48, 102

[56] References Cited

U.S. PATENT DOCUMENTS

| 4,622,674 | 11/1986 | Mito | 372/45 |
| 4,961,198 | 10/1990 | Ishino et al. | 372/50 |

FOREIGN PATENT DOCUMENTS

| 61-168980 | 7/1986 | Japan | 372/50 |

OTHER PUBLICATIONS

Aoki et al, "InGaAs/InGaAsP MQW Electroabsorption Modulator Integrated with a DFB Laser Fabricated by Band-Gap Energy Control Selective Area MOCVD", IEEE Journal of Quantum Electronics, vol. 29, No. 6, pp. 2088–2096 Jun. 1993.

*Primary Examiner*—Rodney B. Bovernick
*Assistant Examiner*—Yisun Song
*Attorney, Agent, or Firm*—Oblon, Spivak, McClelland, Maier & Neustadt, P.C.

[57] ABSTRACT

An integrated monolithic laser-modulator component having a multiple quantum well structure. This component includes an InP substrate, a laser (L) formed from a stack of semiconductor layers epitaxied on the substrate, including an active and absorbent layer and a periodic Bragg grating fixing the emission wavelength of the laser to a value slightly above an optimum wavelength of the laser gain peak. An electrooptical modulator (M) is formed from the same stack of semiconductor layers, with the exception of the Bragg grating, the active layer of the laser and the absorbing layer of the modulator being formed by the same epitaxied structure having several constrained or unconstrained quantum wells, the modulator functioning according to a confined Stark effect. The semiconductor layers of the laser and those of the modulator are electrically controlled.

11 Claims, 3 Drawing Sheets

INTEGRATED MONOLITHIC LASER-MODULATOR COMPONENT WITH MULTIPLE QUANTUM WELL STRUCTURE

This application is a Continuation of application Ser. No. 08/561,549, filed on Nov. 21, 1995, now abandoned; which is a Continuation Application of application Ser. No. 08/253, 252, filed on Jun. 2, 1994 now abandoned.

BACKGROUND OF THE INVENTION

1. Field of the Invention

The present invention is directed to a semiconductor material integrated, monolithic laser-modulator component using the same multiple quantum well structure. This structure is usable mainly in the field of fiber optics telecommunications, e.g. for high speed, long distance digital links, as well as in the field of all optical computers.

The present invention uses a method of intensity modulation of a light beam varying the optical absorption of a material under the effect of an electrical field. The electrical field is, e.g., applied by means of a negative biased PIN diode in which the not intentionally doped, intrinsic region contains an electroabsorbant or active material.

2. Background of the Invention

The monolithic integration of a semiconductor laser and a power electrooptical modulator of the light flow emitted by the laser forms the subject matter of numerous works as a result of the importance thereof in optoelectronics. This integration is a basis for strategic research and development, particularly in the field of fiber optics telecommunications at 1.55 μm for the high speed, long distance transfer of information.

The corresponding integrated component has a large passband and in particular no spectral broadening, which are associated with an external modulation of the emitting laser diode (see, e.g., in this connection a document (1) F. Koyama and K. Iga, "Frequency Chirping in External Modulators", Journal of Lightwave Technology, vol. 6, No. 1, 1988, pp 87-93).

However, the integration technology must remain as simple as possible and in particular must preserve the properties of the two optoelectronic elements (laser and modulator).

The integrated components (laser-modulator) are formed from similar, semiconductor, epitaxied layers, forming PIN diodes which are positively biased for the laser and negatively biased for the modulator.

The integration of a laser and a modulator operating at about 1.55 μm is described in a document (2), FR-A-2 681 191 using the Wannier-Stark effect with a highly coupled superlattice. It is pointed out that a highly coupled superlattice or SL is a succession of wells and potential barriers (generally 20 to 30) in which the respective thicknesses of the wells and barriers are very small, so that the wells are highly coupled to one another by the resonant tunnel effect.

A distinction is made between such a structure and a multiple quantum well or MQW structure, which is also a succession of well and potential barriers (generally below 20), in which the thickness of the barriers is sufficiently great for the wells not to be coupled with one another.

Other integrated, monolithic components operating at 1.55 μm have been described in a document (3) by M. Suzuki et al, "λ/4-shifted DFB Laser/Electroabsorption Modulator Integrated Light Source For Multigigabit Transmission", IEEE Transactions on Lightwave Technology, vol. 10, No. 1, 1992, pp 90–95 using a Franz-Keldysh effect modulator, and in a document (4), I. Kotaka et al, "A Low-Drive-Voltage, High-Speed Monolithic Multiple-Quantum-Well Modulator/DFB Laser Light Source", IEEE Photonics Technology Letters, vol. 5, No. 1, 1993, pp 61–63, using a confined Stark effect modulator.

The integrated modulators of documents (3) and (4) operate at wavelengths above those of the edge of the absorption band of the active layer of the modulator, due to the fact that the application of an electrical field to the electroabsorbant material induces a shift of the absorption front towards high wavelengths, i.e. towards low energies, known as red shift. This means that the application of a negative biased electric field can only increase the absorption of an initially transparent material by using these effects. Thus, the material of the active layer of the modulator must be sufficiently transparent in the absence of an electric field. However, in the case of the laser, the stimulated emission occurs at an energy substantially equal to that of the forbidden band of the active layer of the laser, particularly for low carrier injection levels.

It is for these reasons that for monolithic laser-modulator components operating at 1.55 μm on an InP substrate, hitherto use has been made of different active layers and therefore different forbidden energy bands for the laser and modulator. Thus, in documents (3) and (4), use is made of two epitaxy stages in order to separately grow the two structures, with an optimum wavelength shift.

Another approach for separately obtaining the two structures is described in a document (5), by V. Hornung et al, "Simple Approach For Monolithic Integration Of DFB Laser And Passive Waveguide", Electronics Letters, vol. 18, 1991, pp 1683–1685. In this document, use is made of a single epitaxy for the two components on a previously etched substrate with separate optimization of the two structures.

More recently, consideration has been given to the integration of the laser and the modulator with the aid of a single selective epitaxy with silica masks using a multiple quantum well structure of type InGaAs/InGaAsP, as described in a document (6) by M. Aoki et al, "High-speed (10 Gbits/s) and Low-Drive-Voltage (1V peak to peak) InGaAs/InGaAsP MQW Electroabsorption-Modulator Integrated DFB Laser With Semi-Insulating Buried Heterostructure", Electronics Letters, vol. 28, No. 12, 1992, pp 1157–1158.

In this case, there is no growth on the masked zones contrary to the unmasked zones, so that there is a wavelength shift between the masked and unmasked zones. This shift is a function of the shape of the masks used for the selective growth and can be precisely controlled.

The use of two different structures for the laser and the modulator leads to a certain number of disadvantages, particularly with respect to the production process for the components.

Thus, the solutions requiring two epitaxies (documents 3 and 4) suffer from the disadvantages of being onerous and complicated, both with regards to the epitaxy and with regards to the technology (technological stages on a non-planar substrate). It is therefore difficult to maintain the performance characteristics of the two components during integration.

Moreover, the use of a single epitaxy on an etched substrate (document 5) also requires a good optimization of the growth parameters. This solution also suffers from the disadvantages of a technology on non-planar samples.

Thus, "planar" solutions would have the advantage of a similar technology to that used for discreet components, i.e. simpler and with a better efficiency.

In the case of a single, selective, planar epitaxy, it is necessary to have an optimization both of the mask type and its shape, as well as the preparation of the surface before epitaxy. Therefore it is difficult to perform this method. In addition, the wavelength change obtained with this method is gradual and extends over an excessive transition zone, so that absorption losses can occur.

The use of a single planar epitaxy of the same active layer using quantum wells on a GaAs substrate for an operation at 0.8 μm has been described in a document (7) by S. Tarucha and H. Okamoto, "Monolithic Integration Of A Laser Diode And An Optical Waveguide Modulator Having A GaAs/AlGaAs Quantum Well Double Heterostructure", Applied Physics Letters 48, (1) 1986, pp 1–3, and in a document (8) by W. X. Zou et al, "Low-Threshold InGaAs/GaAs/AlGaAs Quantum-Well Laser With An Intracavity Optical Modulator By Impurity-Induced Disordering", Applied Physics Letters 62, (6), 1993, pp 556–558.

A priori this solution would appear difficult to understand in view of the fact that the optimum operating wavelength of the modulator would have to be shorter than the emission wavelength of the laser. In order to explain this unusual behaviour, document (7) refers to the "gap restandardization" effect, which leads to a reduction in the effective bandwidth of the active layer of a laser under positive bias, which is linked with the increase in the density of the carriers injected into the active layer.

Document (8) describes InGaAs constrained quantum wells and the manufacture of lasers with the aid of an interdiffusion method (variation of the forbidden bandwidth induced by silicon diffusion). The use in this case of constrained wells has the advantage of significantly reducing the carrier injection currents in order to achieve transparency, because the threshold currents of the laser are reduced compared with conventional GaAs quantum wells, as in document (7). The disadvantage of GaAs compounds is their operating range which is so different from that of structures on InP.

Documents (7) and (8) use a Fabry-Perot laser with an "intracavity" modulator forming the passive part of the cavity which, on optical pumping induced by the laser part, becomes transparent with the aid of a relatively small photon flow. In this type of laser, the absorption losses of the modulator in the conductive state, i.e. in the absence of an electric field applied, remain very high. Moreover, the emission line is generally wide.

However, the production solution recommended in documents (7) and (8) remains in principle ideal, because it is based on a single planar epitaxy of the same active layer for the laser and the modulator.

This single planar epitaxy principle for the active layer is also used in document (2). However, in this case, the Wannier-Stark effect modulators are produced in the InGaAlAs/InP system. These materials suffer from the disadvantage of containing aluminum, which is difficult to work, and their technology is not as developed as that of components based on phosphorus (InGaAsP).

A laser equipped with a periodic Bragg grating is known under the name Distributed Feedback or DFB laser and the possibility of producing DFB lasers emitting over a wide wavelength range and at wavelengths determined by the spacing of a Bragg grating has been demonstrated for wavelength multiplexing applications in a document (9) by C. E. Zah et al "1.5 μm Compressive-Strained Multiquantum-Well 20-Wavelength Distributed Feedback Laser Arrays", Electronics Letters, vol. 28, No. 9, 1992, pp 824–826. In the document, twenty different wavelengths could be measured on a range of 131 nm around 1.5 μm.

It is also known from a document (10) by F. Devaux et al, "In GaAsP/InGaAsP Multiple-Quantum Well Modulator With Improved Saturation Intensity and Bandwidth Over 20 GHz", IEEE Photonics Technology Letters, vol. 4, 1992, pp 720–723, that a MQW structure modulator with barrier layers and InGaAsP quantum wells has good characteristics.

However, hitherto no one has brought about the integration of a laser and a modulator using as the active layer a MQW structure formed during the same planar epitaxy.

SUMMARY OF THE INVENTION

Accordingly, one object of the present invention is to provide a novel integrated, monolithic laser-modulator which overcomes the drawbacks in the conventional devices.

More particularly, the present invention is directed to a novel integrated, monolithic laser-modulator component formed on InP for emission at 1.55 μm, using the same active structure for the electroabsorbant layer of the modulator and the emitting layer of the laser, produced with the aid of a single planar epitaxy. This active layer is a structure of the multiple quantum well type with a modulator operating according to a confined Stark effect.

The use of the same active layer for the laser and the modulator is made possible by the use of a periodic Bragg grating fixing an emission wavelength of the laser at a value slightly above a wavelength corresponding to a maximum of the gain peak of the laser and therefore to a wavelength slightly above that corresponding to the absorption peak of the modulator. According to the present invention, the wells may or may not be constrained.

The use of the same active layer is also made possible by the fact that the MQW lasers, and in particular constrain MQW lasers, which is particularly the case for InGaAsP and InGaAs structures on InP, have a sufficiently wide gain curve to be able to adjust, due to the Bragg grating used in the construction of the laser, the emission wavelengths of the laser to the optimum modulation value of the electroabsorbant layer of the modulator.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
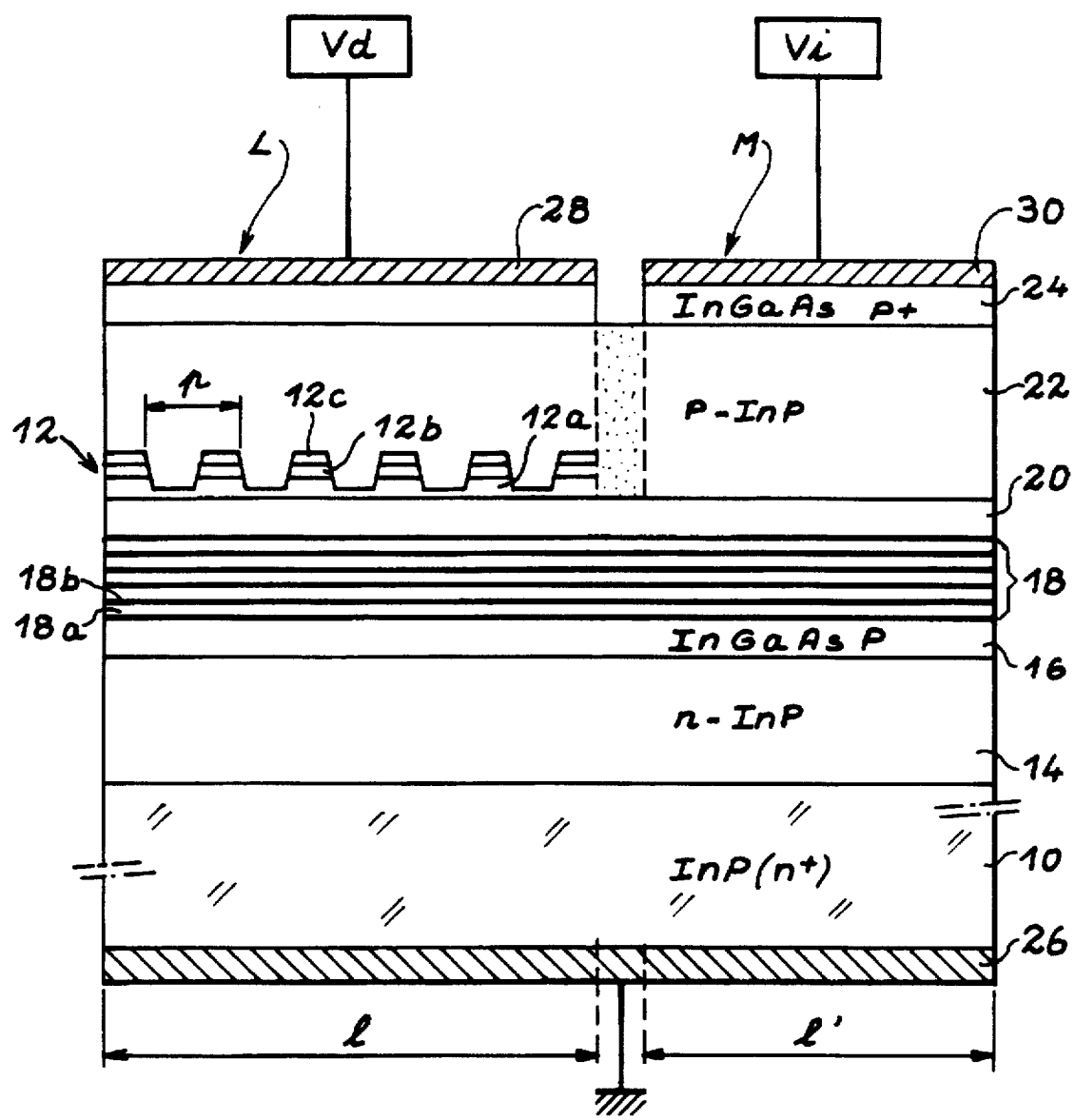
FIG. 1 shows diagrammatically and in cross-section, a monolithic component according to the present invention.

Referring now to the drawings, wherein like reference numerals design identical or corresponding parts throughout the several views, and more particularly to FIG. 1 thereof, there is shown a monolithic component according to the present invention which comprises a laser L and a modulator M produced on a same N+ doped InP substrate 10 at $5 \cdot 10^{18}$ ions/cm$^3$ and having a planar surface. On the substrate 10 are epitaxied identical semiconductor layers for the laser L and the modulator M, with the exception of the presence of a periodic Bragg grating 12 for the laser. The semiconductor layers are epitaxied according to the MOCVD or metalorganic chemical vapor deposition procedure.

In succession are provided a N doped InP buffer layer 14 typically at $2 \cdot 10^{18}$ ions/cm$^3$ and with a thickness of 500 nm, a lower, undoped, 100 nm thick, optical confinement layer 16, a 150 nm thick, active layer 18 having 5 to 12 quantum wells 18a separated by undoped, InGaAsP potential barriers 18b, an undoped, 100 nm thick, InGaAsP, upper optical confinement layer 20, the Bragg grating 12 retained solely on the side of the laser L, a P doped InP layer 22 thus completing the PIN diode of the laser and the modulator and ensuring the burying of the active structure, the layer 22 being doped at $10^{18}$ ions/cm$^3$ and having a thickness of 1.8 µm, and finally a P+ doped InGaAs electric contact layer 24 at $10^{19}$ ions/cm$^3$ and with a thickness of 200 nm.

The In and P composition of the confinement layers 16 and 20 must be such that their optical index is above that of the layers 14 and 22 of the diode, but below that of the quantum wells 18a. Moreover, the In and P composition of the barrier layers 18b of the MQW structure must be such that the forbidden energy band of these barriers is above that of the quantum wells 18a.

Respecting the index and forbidden band principle, it is possible to replace the quaternary InGaAsP material by the ternary InGaAs material.

For example, the layers 16 and 20 have a respective In and P composition of 0.79 and 0.44, the barrier layers 18b a respective In and P composition of 0.79 and 0.44 and the quantum wells 18a a respective In and P composition of 0.70 and 0.13.

There are, e.g., ten wells, in order to improve the modulation performance characteristics without reducing the characteristics of the laser. Their thickness is 10 nm and the thickness of the barriers 5 nm.

The periodic Bragg grating 12 is made from an undoped InP/InGaAsP/InP three-layer material etched in order to form a periodic structure, whose spacing p fixes the emission wavelength of the laser. For layers 12a, 12c and 12b with respective widths 50, 30 and 30 nm, use is made of a 240 nm spacing so as to obtain a laser operating at 1.550 µm.

The Bragg grating is produced by standard holographic methods, followed by a wet chemical etching, using an appropriate mask on the modulator part so that it is only formed on the laser part.

The layers 12, 14, 16, 18 and 20 are formed during a first planar epitaxy and the layers 22 and 24 are formed during a second planar epitaxy.

The structure shown in FIG. 1 is of the BRS or Buried Ridge Striped type, but other structures, particularly ridge-ridge or BRS-ridge, can also be considered.

The component also has a metal layer 26 formed on the lower surface of the substrate 10 and which is to be raised to ground potential and an upper metal layer deposited on the contact layer 24.

In order to ensure the electrical insulation of the laser L and the modulator M, the upper and semiconductor metal layers 24 undergo etching, forming an upper electrode 28 on the laser L and an upper electrode 30 on the modulator M, followed by an implantation of protons in the thus produced trench and over the entire thickness of the layer 22.

The upper electrode 28 of the laser L is positive biased by a voltage source Vd, whereas the electrode 30 of the modulator M is negative biased by a voltage source Vi.

It is clear that the successive epitaxy of the different layers leads to an excellent optical coupling between the laser and the modulator.

The width l of the laser strip is 300 to 600 µm, as a function of needs. In the same way, the length l' of the modulator strip is 100 to 300 µm and typically 300 µm.

In order to minimize the capacitance of the component, the electrical contacting on the modulator side is obtained with the aid of a stud on polyimide.

The wavelength compatibility of the two components will now be demonstrated with reference to FIGS. 2 to 5 using an active layer with five constrained quantum wells of a quaternary material with an In and P composition of 0.70 and 0.13 for the barrier layers in In and P of 0.79 and 0.44, the wells having a thickness of 6 nm and the barriers a thickness of 19 nm.

Figure 2:
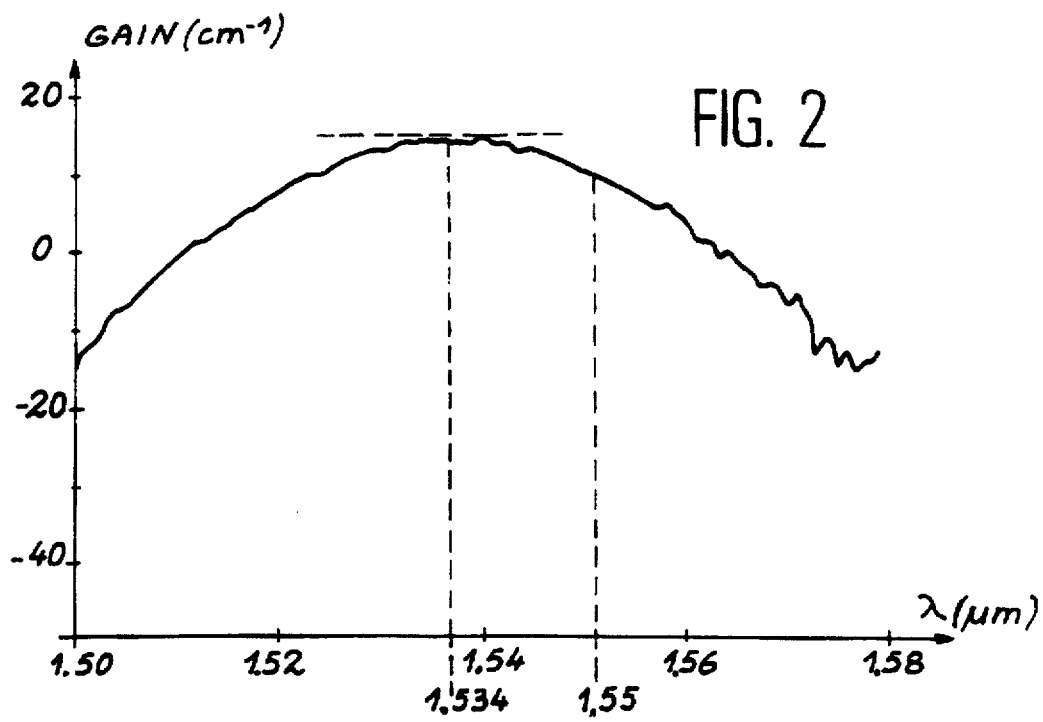
FIG. 2 show the gain in $cm^{-1}$ of the laser as a function of the emission wavelength λ in μm, for a laser using an active MQW layer with five constrained quantum wells.

FIG. 2 shows the gain curve as a function of the emission wavelength for a Fabry-Perot laser using an active layer 18 with five quantum wells. As can be seen from FIG. 2, this type of material has a gain on a wide wavelength spectrum. Thus, a laser effect can be obtained with such a structure between 1.52 and 1.56 µm, the gain maximum being 1.534 µm.

Figure 3:
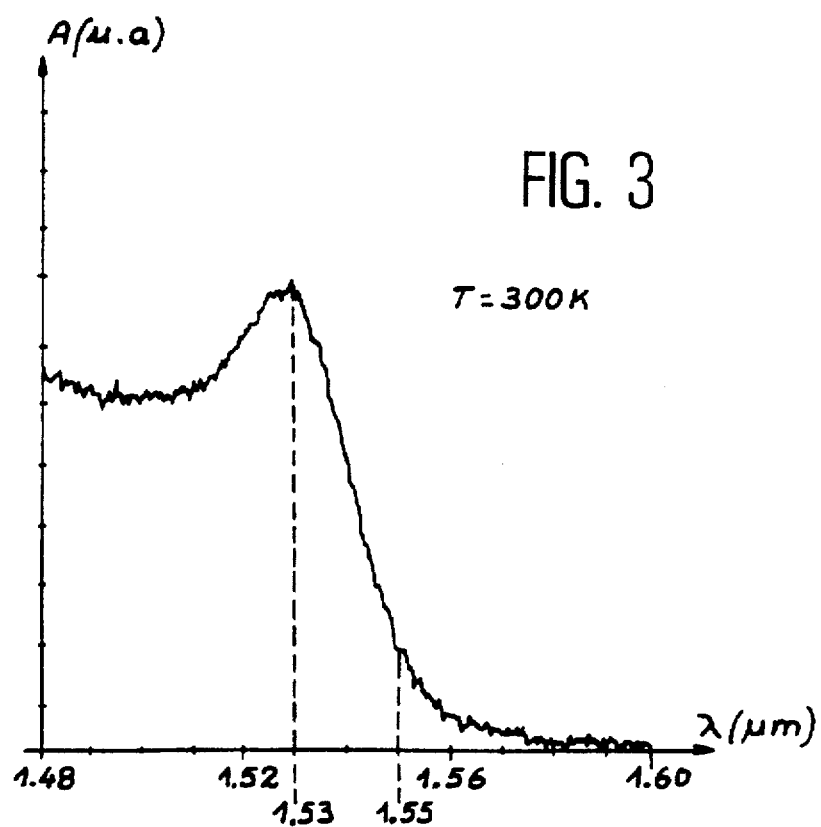
FIG. 3 shows the exciton absorption spectrum A, in arbitrary units, as a function of the wavelength λ in μm, for the same quantum well structure as that of FIG. 2.

With the same active layer with five quantum wells, the inventors have measured the exciton absorption spectrum. This spectrum is shown in FIG. 3 and gives the absorption variations, as a function of the wavelength, at a temperature of 300 K. This curve shows that the absorption peak at 1.53 µm of the active layer coincides with the gain curve peak at 1.534 µm.

In order to obtain an optimum modulation wavelength compatibility, the spacing of the Bragg grating is adjusted so that the laser emits at 1.550 µm, the wavelength corresponding (see FIG. 3) to the exciton absorption threshold of the modulator. Moreover, at such a wavelength, the absorption by the modulator in the conductive state (i.e. the transparent state) is low. Moreover, for the laser (see FIG. 2), the gain is still high and exceeds 10.

FIG. 3 also shows that the exciton absorption front is very abrupt and that the optimum modulation wavelength at 1.55 µm is very close to the exciton threshold at 1.56 µm.

Figure 4:
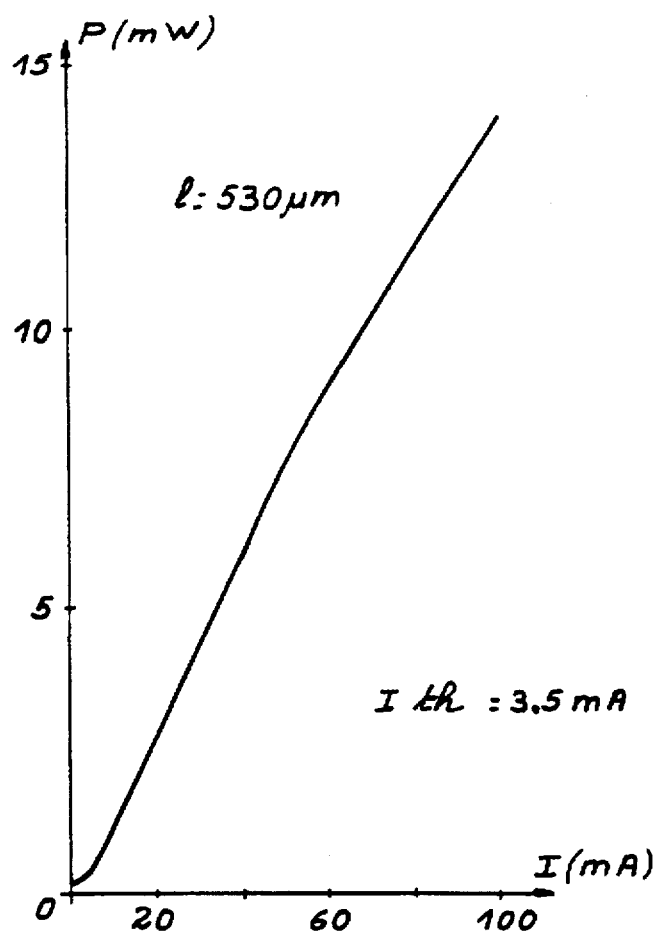
FIG. 4 shows the laser emission power P in mW, as a function of the current I in mA applied to the component of the present invention having the same MQW structure as that of FIG. 2.

Detuning generally induces an increase in the threshold current of the lasers, which varies as a function of the value of the shift and can lead to a malfunctioning of the laser. However, FIG. 4 shows the variations of the laser power as a function of the current applied to it (minimum current necessary for laser emission) and that the threshold current of the laser only is extremely low, namely below 5 mA and typically 3.5 mA, for a laser length l' of 530 µm.

Figure 5:
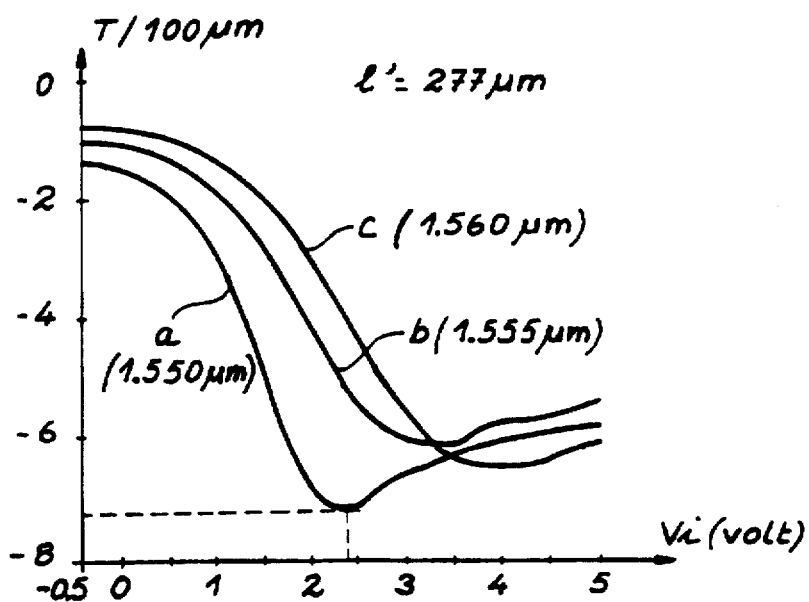
FIG. 5 shows the transmission curve T in decibels per length unit of a component according to the present invention as a function of the bias voltage Vi in volts and for different wavelengths.

FIG. 5 also shows the electrooptical modulation performance characteristics of the same structure. Curves a, b and c give the transmission of the modulator respectively for three wavelengths 1.550, 1.555 and 1.560 µm as a function of the bias voltage Vi applied to the modulator. These are the curves of a modulator, whose length l' is 277 µm.

These curves show that the optimum behavior of the modulator is at 1.550 µm, because the minimum transmission is below 7 dB for a modulation length of 100 μm, which corresponds to an extinction or absorption level of 17 dB for a modulation length of 277 μm, compared with the reference level corresponding to a 100% transmission. However, the maximum absorption is only obtained at a value of approximately 6 dB for a 100 μm modulation in case (b) and (c).

This optimum absorption is also obtained for a voltage Vi applied in reverse to the modulator, below 2.5 V for case (a), whereas the voltage exceeds 3.2 V for cases (b) and (c).

Thus, the integration of these two components (laser and modulator) leads to satisfactory modulation characteristics which are compatible for a high speed, 10 Gbit/s, long distance optical transmission. In such an application type, the laser emits continuously.

The above description has only been given for illustration and other compositions for the different semiconductors layers, as well as other thicknesses and doping levels can be envisaged.

Obviously, numerous modifications and variations of the present invention are possible in light of the above teachings. It is therefore to be understood that within the scope of the appended claims, the present invention can be practiced otherwise than as specifically described herein.

What is claimed as new and desired to be secured by Letters Patent of the United States is:

1. An integrated, monolithic electrooptical component comprising an InP monocrystalline substrate, a laser having a stack of semiconductor layers epitaxied on said substrate, including an active and absorbing layer formed as a continuous layer, first and second optical confinement layers formed on opposite sides of the continuous active and absorbing layer and a periodic Bragg grating fixing an emission wavelength of the laser to a value slightly above a wavelength corresponding to a maximum of the laser gain peak, separated from the continuous active and absorbing layer by the first optical confinement layer, an electrooptical modulator formed from a stack of semiconductor layers epitaxied on said substrate, including the continuous active and absorbing layer, means for applying to the stack of layers of the laser a positive voltage leading to the emission by the continuous active and absorbing layer of the laser of a radiation traversing the continuous active and absorbing layer of the modulator in a plane of said layer, means for applying to the stack of layers of the modulator a negative voltage leading to an absorption of said radiation by the continuous active and absorbing layer, wherein the continuous active and absorbing layer of the laser and the continuous active and absorbing layer of the modulator are formed by the same epitaxied structure and the continuous active and absorbing layer having several quantum wells, the modulator functioning according to the confined Stark effect, and wherein the Bragg grating is separated from the modulator by a trench implanted with protons, the trench extending only to the first optical confinement layer.

2. The component according to claim 1, wherein the wells are constrained.

3. The component according to claim 1, wherein the semiconductor layers are aluminum-free.

4. The component according to claim 2, wherein the semiconductor layers are aluminum-free.

5. The component according to claim 1, wherein the active layer and the absorbent layer are formed from undoped, InGaAsP or InGaAs quantum wells separated by undoped InGaAsP or InGaAs barrier layers, the In and P composition being chosen in such a way that the wells have a forbidden energy band below that of the barrier layers.

6. An integrated, monolithic electrooptical component comprising:
    an InP monocrystalline substrate;
    an active and absorbing layer having a plurality of quantum wells and formed as a continuous layer;
    first and second optical confinement layers formed on opposite sides of the continuous active and absorbing layer;
    a Bragg grating fixing an emission wavelength of an emitted light to a value slightly above a wavelength corresponding to a maximum of the laser gain peak, formed at a first portion of the continuous active and absorbing layer, separated from the continuous active and absorbing layer by the first optical confinement layer, wherein the InP monocrystalline substrate, the continuous active and absorbing layer, the first and second optical confinement layers and the Bragg grating form a stacked structure as a laser;
    a first voltage applying means for applying a first positive voltage to the stacked structure of the laser, resulting in emission by the continuous active and absorbing layer, to generate laser emission; and
    a second voltage applying means for applying a negative second voltage at a second portion of the continuous active and absorbing layer, the second portion of the continuous active and absorbing layer formed as a layer of a modulator, resulting in an absorption of radiation by the continuous active and absorbing layer; and
    wherein the Bragg grating is separated from the modulator by a trench implanted with protons, the trench extending only to the first optical confinement layer.

7. The component according to claim 6, wherein the plurality of quantum wells are constrained.

8. The component according to claim 6, wherein the active and absorbing layer is formed from undoped InGaAsP quantum wells separated by undoped InGaAsP barrier layers, wherein the quantum of the quantum wells have a forbidden energy band below that of the barrier layers.

9. The component according to claim 6, wherein the active and absorbing layer is formed from undoped InGaAs quantum wells separated by undoped InGaAs barrier layers, wherein the quantum of the quantum wells have a forbidden energy band below that of the barrier layers.

10. The component according to claim 1, wherein the Bragg grating includes a periodic structure of periodic undoped three-layer InP/InGaAsP/InP structures.

11. The component according to claim 6, wherein the Bragg grating includes a periodic structure of periodic undoped three-layer InP/InGaAsP/InP structures.

* * * * *